United States Patent [19]

McCoy et al.

[11] 4,019,109
[45] Apr. 19, 1977

[54] ALIGNMENT SYSTEM AND METHOD WITH MICROMOVEMENT STAGE

[75] Inventors: John H. McCoy, Newbury Park; Paul A. Sullivan, Santa Monica, both of Calif.

[73] Assignee: Hughes Aircraft Company, Culver City, Calif.

[22] Filed: Apr. 5, 1976

[21] Appl. No.: 673,553

Related U.S. Application Data

[63] Continuation of Ser. No. 469,154, May 13, 1974, abandoned.

[52] U.S. Cl. .............................. 318/640; 318/687; 248/425
[51] Int. Cl.[2] ....................................... G05B 19/18
[58] Field of Search ................ 318/640, 687, 603; 248/425, 186, 349; 356/172; 219/121

[56] References Cited

UNITED STATES PATENTS

| | | | |
|---|---|---|---|
| 3,037,156 | 5/1962 | Koulikovitch | 318/687 |
| 3,429,155 | 2/1969 | Hines | 318/687 X |
| 3,457,422 | 7/1969 | Rottmann | 318/640 X |
| 3,466,514 | 9/1969 | Brunner | 318/640 X |
| 3,622,856 | 11/1971 | Willis | 318/640 |
| 3,786,332 | 1/1974 | Hepner et al. | 318/640 X |
| 3,789,285 | 1/1974 | Nishizawa | 318/640 X |
| 3,843,916 | 10/1974 | Trotel et al. | 318/687 X |
| 3,904,945 | 9/1975 | Hassan et al. | 318/601 |

OTHER PUBLICATIONS

IBM Tech. Disc. Bull., vol. 15, No. 12, May 1973, pp. 3889 to 3890.
Aronstein et al., "Frictionless X, Y, Z and Theta Micropositioning Table."

Primary Examiner—B. Dobeck
Attorney, Agent, or Firm—Lewis B. Sternfels; W. H. MacAllister; W. J. Bethurum

[57] ABSTRACT

Alignment of a mask and a semiconductor wafer to be processed is effected by orthogonal and angular movements of the mask singly and in combination. A carrier for the mask is supported on four orthogonally positioned transducers which, when actuated to elongate or contract, produce carrier translational movement in either or both orthogonal directions and/or rotational movement by selective elongation and contraction of one or more transducers. Actuation of the transducers and the alignment are obtained by signals from a feedback system including photon detection and multiple frequency oscillation utilizing alignment marks on the mask and the wafer.

16 Claims, 12 Drawing Figures

ALIGNMENT SYSTEM AND METHOD WITH MICROMOVEMENT STAGE

This is a continuation of application Ser. No. 469,154, filed May 13, 1974, now abandoned.

BACKGROUND OF THE INVENTION

1. Field of the Invention

The present invention relates to means and method for producing orthogonal and angular motions, singly and in combination. In a preferred embodiment, these motions are utilized for precise and micron adjustment between relatively moveable elements.

2. Description of the Prior Art

There is a recongized need for smaller electronic devices such as for acoustic wave, integrated optic, superconducting weaklink, and semiconductor purposes, including discrete transistor, LSI, MSI, and SSI semiconductor devices. The smallest of possible devices that can be presently mass manufactured outside of laboratory fabrication are limited by their size to approximately 5 micron line width due to conventional photolithographic limitations resulting from scattering, reflection and diffraction of light, such as ultraviolet light. In the laboratory, 1 micron lines can be produced utilizing ultraviolet light; however, the precision available and used in laboratories is not economically available for mass production.

It is known that smaller than 1 micron size lines can be obtained using x-ray lithography, for example, see D. L. Spears and H. I. Smith, "High Resolution Pattern Replication Using Soft X-rays," Electronics Letters 8, 102 (1972); D. L. Spears and H. I. Smith, "X-ray Lithography — A New High Resolution Replication Process," Solid State Technology, July 1972, pages 21–26; D. L. Spears, H. I. Smith and E. Stern, "X-ray Replication of Scanning Electron Microscope Generated Patterns," Proceedings of the Fifth International Conference on Electron and Ion Beam Science and Technology (May 1972, Houston) Electrochemical Society, Princeton, 1972, page 80; and H. I. Smith and D. L. Spears, "X-ray Lithography: Complimentary Technique to Electron Beam Lithography," Journal of Vacuum Science and Technology, 10, 913 (1973).

There are several reasons for obtaining smaller devices. In LSI and related work, it is desired to place as much circuitry and components in the smallest possible area, thereby increasing density for cost, weight and space considerations. Certain electronic devices, such as microwave, acoustic wave, and other semiconductor devices, operate more efficiently with maximum performance, and at higher frequencies when they are smaller. Integrated optical circuitry can operate more efficiently when fabricated with perfections which are smaller than the wavelength of light.

In the prior art, replication of patterns has been accomplished by photolithography using ultraviolet light, subject to the resolution limitations described above. Other prior art accomplished replication by parallel electron projection of images from a patterned photocathode, which can provide better resolution than photolithography, for example, see T. W. O'Keefe, "Fabrication of Integrated Circuits Using the Electron Image Projection System," IEEE Transactions ED-17, 465 (1970); W. R. Livesay, "Electron Image Projection Systems for Microcircuit Lithography," IEEE Transactions ED-19, 647 (1972); and W. R. Livesay, "Integrated Circuit Production with Electron Beams," Journal of Vacuum Science and Technology, 10, 1028 (1973).

In the case of photolithographic replication using ultraviolet light, the mask pattern need only be registered to a wafer with an accuracy of about 1 micron. This is accomplished in the prior art by mechanical linkages such as a pantograph. These mechanical linkages are not sufficiently accurate for the submicron registration accuracies required for the high resolution pattern replication accomplished by parallel electron projection or x-ray lithography. These mechanical mask alignment systems have been used under a feedback electrical control for automatic alignment of the wafer to the mask pattern, for example, see K. G. Clark, "Automatic Mask Alignment in MOS/LGI Processing, " Solid State Technology, February 1971, pages 48–54. A serious drawback to these systems is the low constrast of the registration marks on the processed wafer available to the image detection system when using ultraviolet light.

In the case of parallel electron projection, the image of the mask pattern may be registered to a wafer by manipulating this image with a magnetic field transferse to the electron beam; however, this system has several drawbacks. Electron deflection creates distortions and aberrations in the image; image rotation is accompanied by skew. Furthermore, the beam must be extraordinarily shielded against undesired external magnetic disturbances. Thus it is generally preferable to utilize some mechanical movement for moving the wafer and/or the mask with respect to a beam rather than to control the beam movement. When the beam consists of soft x-rays, the option of moving the beam does not exist, because the soft x-ray beam cannot be influenced by external fields.

Micromovement control systems are known, see J. B. Pawley, "A Dual Needle Piezoelectric Micromanipulator for the Scanning Electron Microscope", The Review of Scientific Instruments, 43, 600 (1972), F. L. N-Nagy and G. C. Joyce, "Micromovement Control Systems", International Federation of Automatic Control, Fifth World Congress, Paris, France, June 12–17, 1972, Proceedings, Part 2 (A73-24001 10-10) Dusseldorf, International Federation of Automatic Control, 1972, Pages 23.6.1–23.6.9. However, none of these systems are designed to obtain the combination of orthogonal (X-Y) and angular (θ) micromovements under an electrical control, as required for a lithographic registration system.

Furthermore, prior art systems are deficient in that they use bearings which leads to friction and contacting surfaces, resulting in relative lack of control for movements of less than one micron. Friction precludes perfectly smooth movement between surfaces while micron imperfections of contacting surfaces additionally cause slight movement of the surfaces towards and away from each other.

A micromovement control system has been used with a parallel electron projection lithographic system, see J. E. Piquendar, "Nanoelectronics," Proceedings of the Fifth International Conference on Electron and Ion Beam Science and Technology, May 1972, Houston, Electrochemical Society, Princeton, 1972, Page 31 and J. E. Piquendar, "Nanoelectronic Project and ASTEC Logic," Journal of Vacuum Science and Technology, 10, 1132 (1973). The precise system described by Piquendar is not known; however, it is believed that this system does not produce orthogonal and angular micromovements both singly and in combination and also does not eliminate contacting surfaces.

SUMMARY OF THE INVENTION

The present invention overcomes these and other problems by providing orthogonal and angular micromovements singly and in combination in a substantially frictionless system without the need for bearings. Specifically, but without limitation, the present invention, as configured for a specific use, includes a carrier which is cantilever supported by four orthogonally disposed transducers which are capable of elongating and contracting, singly and in combination, to produce micromovement of the carrier in either orthogonal direction, or combinations thereof, or angular micromovements singly or in combination with translational movement. Another aspect of the present invention, also when adapted to a specific use, provides for a control mechanism for the transducers so as to obtain alignment between a mask and a wafer.

It is, therefore, an object of the present invention to provide orthogonal and angular micromovements, singly and in combination.

Another object is to provide for such micromovements in a substantially frictionless system.

Another object is to provide for precise alignment of mask with respect to a wafer or substrate.

Another object is to provide a mask alignment system using photon detection.

Another object is to provide such a mask alignment system which provides a detectable signal, without imaging, with very good signal-to-noise ratio.

Another object is to provide such a system utilizing a photon or electron detector, a nulling signal and digital signal processing and synchronous detection for obtaining mechanical alignments to accuracies better than 1 micron.

Another object is to provide such a system with electromechanical mask oscillation for error detection, two frequency oscillation with synchronous detection for simultaneous orthogonal and angular error detection, and photon detection and analog and digital signal processing for feedback error processing.

Other aims and objects as well as a more complete understanding of the present invention will appear from the following explanation of exemplary embodiments and the accompanying drawings thereof.

DESCRIPTION OF THE PREFERRED EMBODIMENTS

Figure 1:
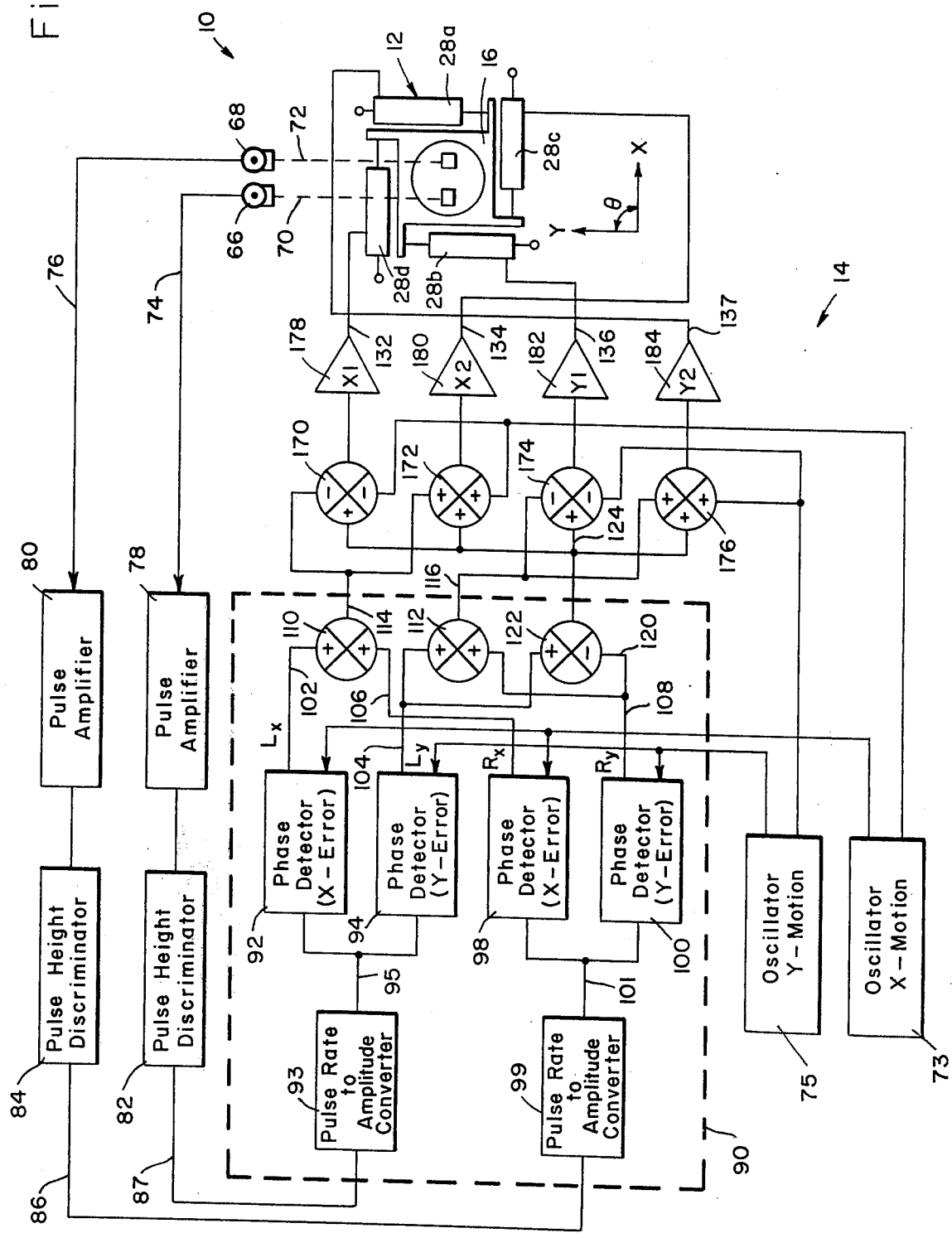
FIG. 1 depicts a block diagram of one embodiment of the present invention comprising a mask alignment system using photon detection and multiple frequency oscillation.

Accordingly, with reference to FIG. 1, a mask alignment system 10 comprises a fine motion or micromovement stage 12 and electronic apparatus 14 for automatically detecting the position of stage 12 and for alignment movements thereof.

Figure 4:
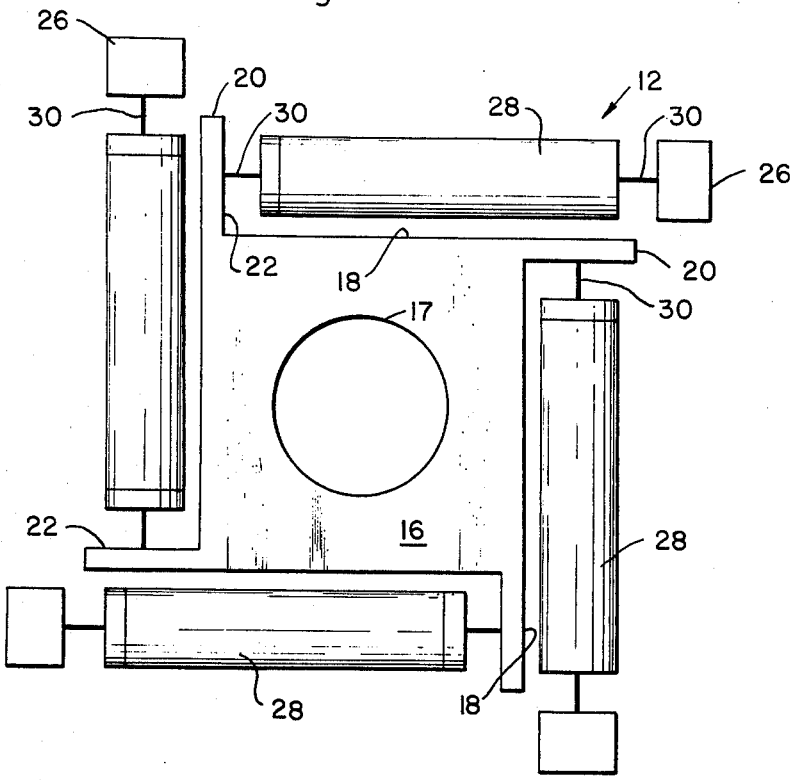
FIG. 4 is a view of a micromovement stage for orthogonal and angular movements of the embodiments shown in FIGS. 1 and 2.
Figure 5:
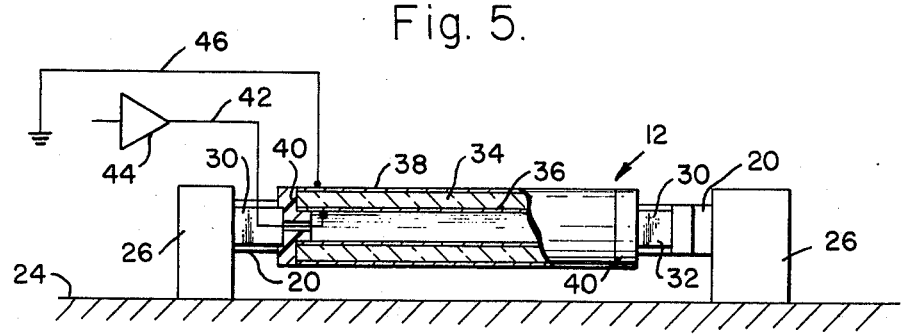
FIG. 5 is a side view of the micromovement stage of FIG. 4, illustrating in partial section a piezoelectric transducer useful in the micromovement stage thereof.

Micromovement stage 12, see FIGS. 4 and 5, comprises a stage or mask carrier 16 which has means thereon for supporting either a mask 60 or a wafer 17 with its pattern 62. Such mask or wafer holding means are well known in the art and, therefore, is not described further. Carrier 16 is preferably rectangular in shape to provide four sides 18 with ears or brackets 20 extending outwardly from the sides to form a continuous extension of each side 18 and a right angle face 22 disposed substantially at right angles with its adjoining face 18. Carrier 16 is cantilever supported by its ears 20 to a fixed support 24 on and to which four anchor blocks 26 are secured. Coupled between each anchor block 26 and ear 22 is a transducer 28 which is respectively secured to its anchor block 26 and ear 22 by flat springs 30. The flat springs have broad faces 32 which are placed parallel to sides 18, so that only motion in the plane of stage 12 is allowed.

Figure 6:
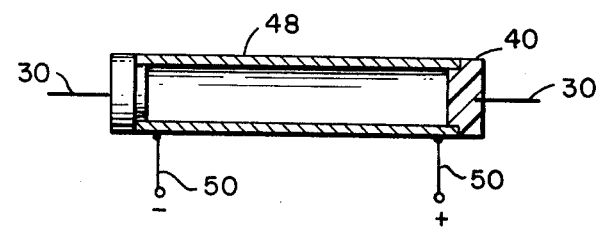
FIG. 6 is a view of a thermally expandable transducer useful as an alternate to the piezoelectric transducer in the stage depicted in FIGS. 4 and 5.
Figure 7:
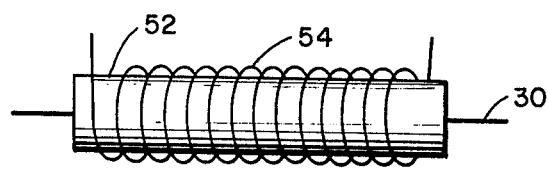
FIG. 7 is a view of a magneto-strictive transducer useful as an alternate to the piezoelectric transducer in the stage shown in FIGS. 4 and 5.

Transducers 28 are adapted to elongate or contract upon a command signal and, therefore, may comprise any construction directed to this end result. FIGS. 5–7 depict three transducer arrangements, FIG. 5 illustrating a piezoelectric ceramic embodiment, FIG. 6 illustrating a thermally expensive embodiment, and FIG. 7 showing a magneto-strictive embodiment.

The piezoelectric transducer of FIG. 5 comprises a hollow cylinder 34 of piezoelectric ceramic material having inner and outer metal conductive material 36 and 38 coated on the inner periphery and outer periphery respectively of the piezoelectric ceramic hollow cylinder 34. A pair of caps 40 are secured to the ends of cylinder 34 and its coatings 36 and 38 so that springs 30 may be secured thereto. A lead 42 couples inner metal coating 36 to a high voltage operational type amplifier 44, such as one of amplifiers 178, 180, 182 and 184 of FIG. 1 or FIG. 2, while a lead 46 grounds outer metal coating 38. Upon a signal from amplifier 44, cylinder 34 will elongate or contract according to the information provided.

FIG. 6 illustrates a thermally expensive transducer comprising a cylindrical tube 48 which is capable of contracting and expansion due to heat. Caps 40 at the ends of tube 48 permit securing of the transducer to springs 30. A metallic tube 48 may have connected thereto leads 50 for coupling to a source of voltage to resistively heat the tube. Alternatively, a heat or cooling source or RF induction heating may be applied to tube 48 for expansion or constraction thereof, in which case the tube need not necessarily be constructed of metal.

FIG. 7 depicts a cylinder 52 of magneto-strictive material, such as of a nickel-iron or a nickel-cobalt alloy. Surrounding cylinder 52 is an electric coil 54 which, when energized, induces a magnetic field in cylinder 52 causing it to contract. Springs 30 are secured to the ends of cylinder 52.

Figure 8A:
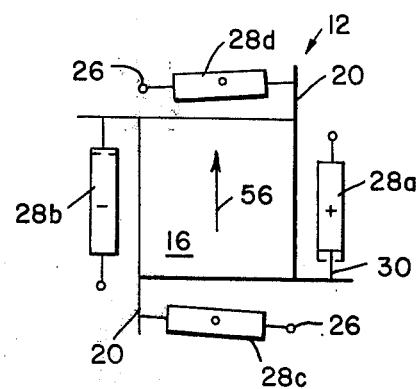
FIGS. 8a and 8b depict two of several possible independent translations and rotations in orthogonal and angular micromovements of the device depicted in FIGS. 4 and 5.
Figure 8B:
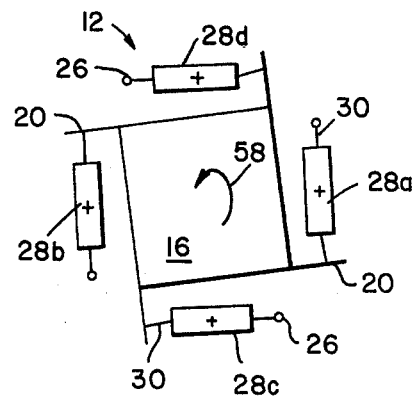

Operation of micromovement stage 12 is illustrated in FIGS. 8a and 8b, respectively showing translational movement and angular movement. In FIG. 8a, translational movement in the direction of arrow 56 is obtained by applying a positive or contracting voltage to transducer 28a and a negative or elongating voltage to transducer 28b so as to cause contraction of transducer 28a and elongation of transducer 28b, thereby moving carrier 16 in the direction of arrow 56. During this operation, transducers 28c and 28d are not actuated, as denoted by symbol "O". To obtain movement of carrier 16 in the direction opposite to that of arrow 56, transducer 28a is caused to elongate while transducer 28b is caused to contract.

To obtain translation of carrier 16 in a direction orthogonal to arrow 56, both transducers 28a and 28b are not energized while transducers 28c and 28d are negatively and positively energized or vice-versa depending upon the direction of movement desired.

Referring to FIG. 8b, angular movement of carrier 16 can be obtained in the direction of arrow 58 by applying a positive signal to all transducers 28 (or to only two parallel transducers 28a and 28b transducers and 28d) so as to cause a simultaneous contraction thereof. This draws ears 20 toward blocks 26 to produce the movement in the direction of arrow 58. Conversely, movement in the direction opposite to that of arrow 58 is caused by application of a negative voltage to all or opposite transducers 28.

For both angular and translational movement in either or both the X and Y directions, it is necessary only to apply a signal to the several transducers 28 appropriately. For example, with respect to FIG. 8a, an applied positive voltage to transducers 28c and 28d, as well as to transducer 28a, but negative voltage to transducer 28b, rotation to the direction of arrow 58 as well as translation in the direction of arrow 56 is obtained. Other combinations of applied voltages will become apparent so that any movement, whether orthogonal (X-Y) or rotational ($\theta$), singly and in combination, may be obtained.

Because springs 30 secure transducers 28 to ears 20 and anchor blocks 26, a resiliency is provided to enable a planar orthogonal and/or rotational movement of carrier 16.

Referring now to FIG. 1, there is shown a functional block diagram of the novel closed loop feedback control system according to the present invention. This closed loop system includes left and right beam detection and signal processing channels including, respectively, left and right x-ray detectors 66 and 68 which are positioned to received left-hand and right-hand x-ray beams 70 and 72. These beams pass, as noted, through both a mask pattern on mask 60 and a wafer pattern 62 (see also FIG. 3) and are periodically interrupted as a result of the relative oscillatory motion between these two patterns as described in greater detail below. These two x-ray detectors 66 and 68 each generate a pulse train output whose instantaneous rate and phase will vary in accordance with the instantaneous misalignment between a pair of marks 64 on the mask 60 and a pair of index openings 65 in the wafer pattern 62.

These corresponding marks and openings on each side of these two masks lie in substantially parallel planes and undergo relative oscillatory motion as the x-ray beam mask or the wafer with its own masking pattern is driven at some predetermined x-motion oscillation frequency and at some predetermined y-motion oscillation frequency. Such relative oscillatory motion is provided by the use of a pair of x and y motion oscillators 73 and 75 to be further described. The exact nature of the rate and phase change produced in the pulse train output of detectors 66 and 68 is described in further detail below following the identification of the various signal processing stages in the closed loop control system of FIG. 1.

The pulse train output signals on lines 74 and 76 leading from the left and right side x-ray detectors 66 and 68 are fed to a pair of pulse amplifiers 78 and 80 for suitably amplifying these pulses, and the amplified pulse outputs from these amplifiers 78 and 80 are coupled to a pair of pulse height discriminators 82 and 84 as shown. This conventional pulse signal processing circuitry ensures that the input pulse trains coupled via lines 86 and 87 to the phase comparison circuitry 90 are free of background noise and of an amplitude sufficient for further processing in this closed loop control circuitry to be described.

For analog signal processing, the pulse trains from discriminators 82 and 84 must be converted to an amplitude signal proportional to the pulse rate in converters 93 and 99.

The phase comparison circuitry 90 of the system includes x-error and y-error phase detectors 92 and 94 connected as shown to the left-hand detection channel 74, and further includes x-error and y-error phase detectors 98 and 100 connected to the right-hand detection channel 76. Furthermore, the x-error phase detectors 92 and 98 in each channel are connected to receive the x-reference frequency signal from the x-motion oscillator 73, whereas the y-error phase detectors 94 and 100 are connected as shown to receive the y-reference frequency from the y-motion oscillator 75. Each of the phase detectors 92, 94, 98 and 100 compare, respectively, the changing amplitude and phase of the inputs received from the pulse rate to amplitude converters 93 and 99 with the constant phase of the reference frequency signals from the x-motion and y-motion oscillators 73 and 75 and thereby generate the left channel x and y direction error signals on lines 102 and 104 respectively and right channel x and y direction error signals on lines 106 and 108, respectively. These latter partial error signals represent, of course, the direction and magnitude of the x and y displacements between marks 64 on mask 60 and the corresponding openings 65 in the wafer pattern 62 on the left-hand and right-hand sides respectively of these two masks.

Figure 3:
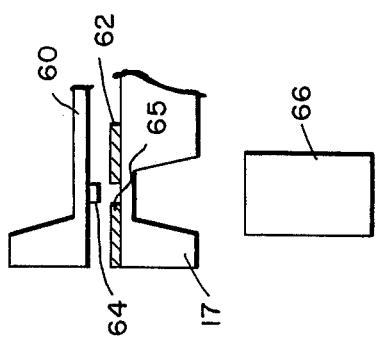
FIG. 3 depicts a schematic representation of registration markings on a mask and an x-ray detector useful in the embodiments depicted in FIGS. 1 and 2.

The left and right x- error signals $L_x$ and $R_x$ on lines 102 and 106 must then be combined in a first summing smplifier 110 in order to generate the composite x-error signal on line 114 as shown. Similarly, the left and right y-direction error signals $L_y$ and $R_y$ are coupled via lines 104 and 108 respectively to the inputs of a second summing amplifier 112 whose output yields the composte y-error signal on line 116 as shown. Additionally, by subtracting right-hand y-direction error signal on line 108 from the left-hand y-direction error signal on line 104 in a substraction amplifier 122, a θ angular rotational error signal on line 124 may be derived. The θ error signal represents the angular rotational misalignment between the x-ray mask 60 and the wafer mask pattern 62 as shown in FIG. 3.

Thereafter, the x, y and θ error signals are then be combined with the x-motion and y-motion oscillator signals in the appropriate summing junctions 170, 172, 174 and 176 and are further amplified in operational amplifiers 126, 128 and 130 whose outputs are directly coupled to the individual piezoelectric supporting members for the beam mask. The latter outputs provide the closed loop nulling action which perfectly aligns the particle beam and wafer masks, respectively.

In order to more completely understand the exact nature of the closed loop control operation according to the present invention, consider first the null condition where x-ray mask 60 is perfectly aligned with wafer pattern 62, and assume for purposes of illustration that the x-ray mask 60 is driven simultaneously in two different predetermined x and y oscillatory motions by the x and y motion oscillators 73 and 75. If the x and y motion oscillators were turned off for this condition, the two masks 60 and 62 would come to rest in perfect alignment in substantially parallel spaced-apart planes. But during the time that the x-ray mask 60 is driven at the x and y motion oscillation frequencies, the two separate marks (64) on the left-hand and right-hand sides of the mask 60 will be oscillated back and forth in both the x and y directions at the x and y oscillation frequencies, respectively. Such movement will periodically interrupt the x-ray beams which pass through the left-hand and right-hand openings (65) in the wafer pattern and impinge on the left-hand and right-hand detectors 66 and 68. These interruptions occur when these openings 65 are perfectly aligned with the respective left-hand and right-hand marks 64 on the mask as shown in FIG. 3.

During the above condition, the x-ray beam interruption is uniformly cyclic and the output signals from converters 93 and 99 are symmetrically cyclic. This output signal condition will be referred to herein as the zero phase or reference phase condition, since the spacing between adjacent half cycles of these signals bears a direct four-for-one relationship to the x and y oscillation period of the oscillators 73 and 75. Furthermore, the width of the output half cycles of the converters 93 and 99 is dependent only upon the frequency of oscillation of the driving signals from the oscillators 73 and 75; and if these latter oscillation frequencies increase, then the width of the output half cycles on signal lines 95 and 101 will correspondingly decrease. Conversely, if the oscillation frequencies of oscillators 73 and 75 decrease, then the width of the output half cycles on lines 95 and 101 will increase.

Figure 9A:
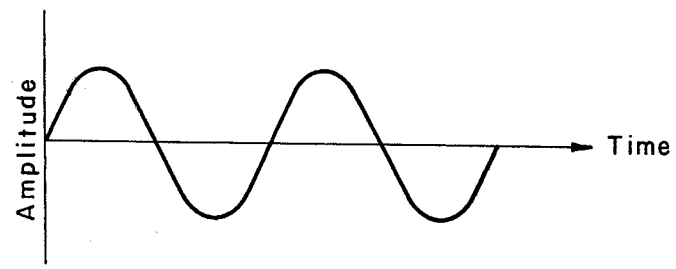
FIGS. 9a, 9b and 9c depict pulse rate outputs shown only with one oscillation frequency at small amplitude oscillation, the other oscillator being inactive for purposes of clarity.
Figure 9B:
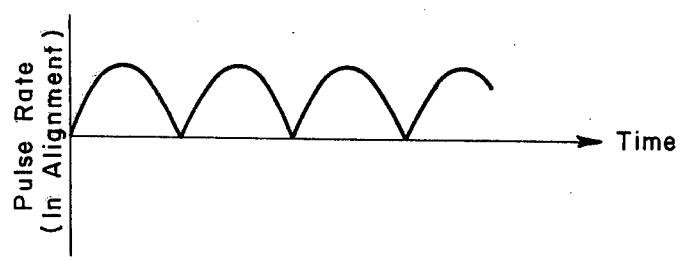
Figure 9C:
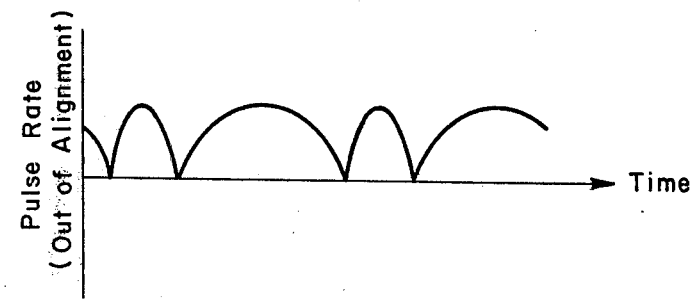

FIGS. 9a, 9b and 9c illustrate the pulse rate outputs at certain locations or nodes within the system of FIG. 1. FIG. 9a illustrates the output waveform of the x-motion oscillator 73, depicting its output amplitude of oscillation. The corresponding pulse rate on lines 74 and 76 for mask and pattern alignment is illustrated in FIG. 9b, and the pulse rate for a corresponding mask and pattern misalignment is illustrated in FIG. 9c. In FIG. 9b, during each half cycle there are many pulses, each of which represents one detected x-ray photon.

Consider now what happens when the indexing marks on the left-hand and right-hand sides of the mask become misaligned with the corresponding indexing openings on the left-hand and right-hand sides of the wafer pattern. This misalignment produces an instantaneous rate change for output pulses on lines 74 and 76, and this rate change is directly proportional to the magnitude of both x direction and y direction misalignments between the marks and openings on the left-hand and right-hand sides of the mask and wafer pattern respectively. However, this pulse rate change on output lines 74 and 76 does not, per se, give an indication of the specific coordinate axis direction that the two masks are misaligned. That is to say, this pulse rate change on lines 74 and 76 does not indicate whether there is a plus x or a minus x orthogonal misalignment or a plus y or a minus y orthogonal misalignment between these two masks. However, in order to provide this indication of coordinate axes misalignment, the nonsymmetric cyclic signal amplitudes from the converters 93 and 99 will be shifted in time phase to one side or to the other side of the above defined zero or reference phase, depending upon whether or not the mask misalignment is in the plus or minus x direction or in the plus or minus y direction. Thus, this shift in phase of the cyclic signal from converters 93 and 99 is sensed by phase detectors 92, 94, 98 and 100 which in turn provide the proper sign and magnitude for the closed loop x, y and θ error signals at the outputs 114, 116 and 124 of the respective summing and substraction amplifiers 110, 112 and 122 respectively. And, as indicated, the magnitude of the instantaneous pulse rate change in each of the two detection channels 74 and 76 will determine the absolute magnitudes of the x, y and θ error signals, respectively, on output lines 114, 116 and 124.

For example, if index mark 64 on the x-ray beam mask 60 and corresponding index opening 65 in the wafer pattern 62 become misaligned in the plus x and minus y directions on the left-hand side of these two masks, then the pulse train output on line 74 will instantaneously undergo a rate change whose magnitude is proportional to the absolute magnitude of this plus x and minus y direction misalignment. Simultaneously, the cyclic variation of these pulses on line 74 will be shifted in phase to one side or the other of the above pre-established zero reference phase for both the x and y fixed frequency signals from the oscillators 73 and 75. Thus, the pulse train output on line 74 will occur either before or after the above zero phase points for the x and y fixed frequency signals, and this combined rate phase change in the pulse train output signals on line 74 is fed through the pulse amplifier and discriminator stages 78 and 82 to the pulse rate to amplitude converter 93 and to the inputs of the x and y error phase detectors 92 and 94. This pulse x and minus y direction misalignment (pulse) condition is now compared to the fixed frequency x and y motion oscillator signals from the oscillators 73 and 75, and the phase detectors 92 and 94 in turn generate $L_x$ and $L_y$ error signals on lines 102 and 104 whose magnitudes and signs are proper for the necessary directional corrections of the above described x and y misalignments.

The above described system is constructed to correct not only the x and y direction misalignment in the left-hand side of the two masks 60 and 62, but also to correct the x and y direction misalignment on the right-hand side of these two masks as well. For example, the left-hand x direction error signal on line 102 must be summed with right-hand x direction error signal on line 106 in the summing amplifier 110, and this summing action of amplifier 110 thus produces the composite x error signal on line 114. The latter signal is thereafter coupled through the output summing amplifiers 170 and 172 to the appropriate system output amplifier stages 178 and 180 and then into the piezoelectric mask alignment correctional scheme previously described.

Similarly, the left-hand y direction error signal on line 104 must be summed with the right-hand y direction error signal on line 108 in the summing amplifier 112 to produce the composite y error signal on line 116 which is then coupled through the summing amplifiers 174 and 176 and into the system output amplifier stages 182 and 184 as shown.

Figure 2:
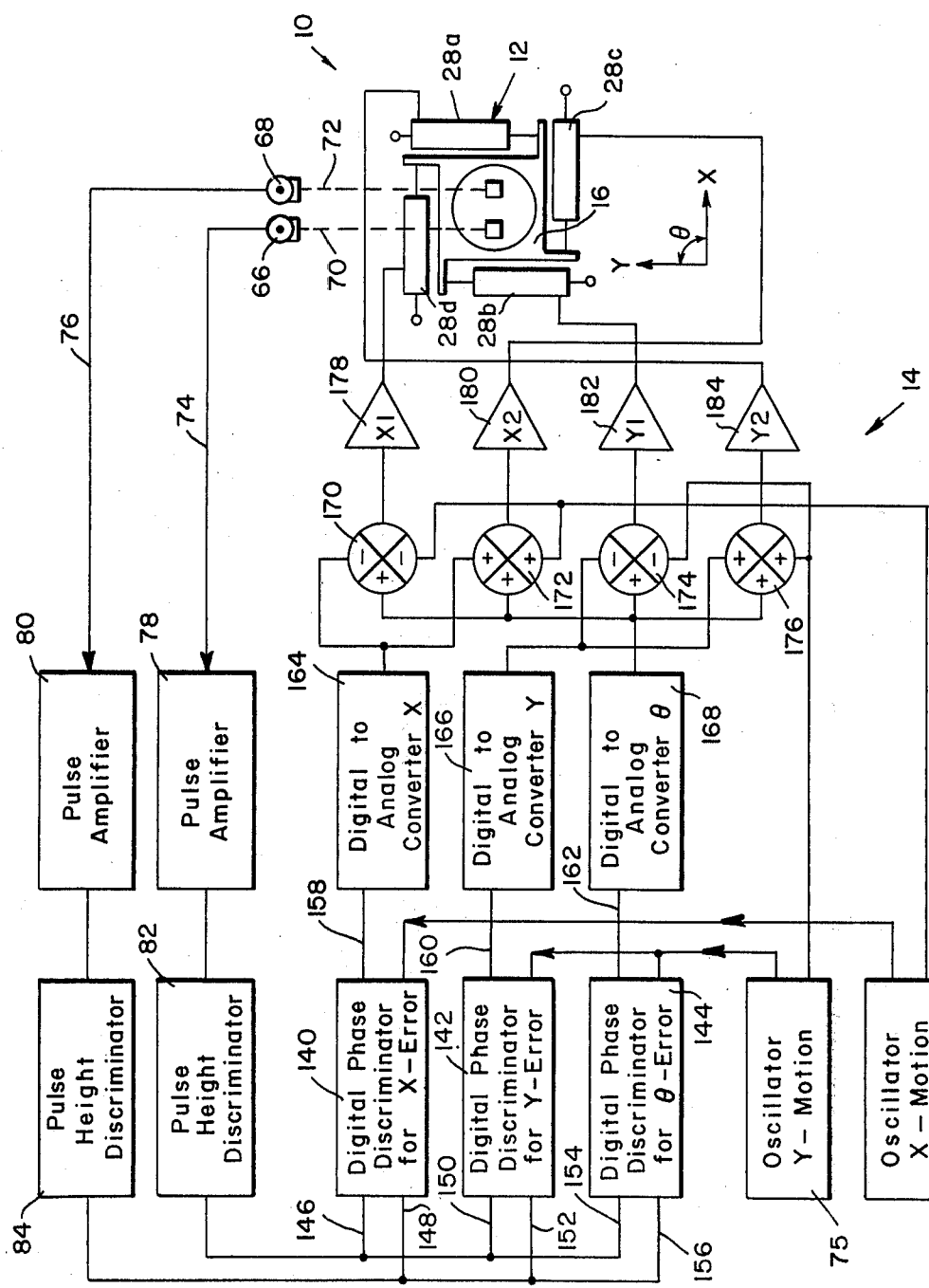
FIG. 2 shows a block diagram of a second embodiment of the present invention presented as an alternate to the automatic system of FIG. 1 for coupling to the micromovement stage thereof.

The present invention is by no means limited to the use of the analog phase detectors 92, 94, 98 and 100 shown, but instead may utilize the digital phase detector scheme illustrated in the alternative embodiment of the invention shown in FIG. 2. In this Figure, the above described analog phase detectors 92, 94, 98 and 100 have been replaced with x, y and θ error digital phase discriminators 140, 142 and 144 whose two separate input terminals 146, 148, 150, 152, 154 and 156 are connected to both the left-hand and right-hand detection channels 74 and 76, and whose single outputs 158, 160 and 162 are connected respectively to x, y and θ digital-to-analog converters 164, 166 and 168 as shown. Additionally, the x and y motion oscillators 73 and 75 are connected to supply the reference frequencies respectively to the x, y and θ error digital phase detectors 140, 142 and 144, and in a preferred embodiment these phase detectors are up-down counters which function in a known manner to produce a particular word output signal to the inputs of the digital-to-analog converters 164, 166 and 168. Each word on these three lines is representative of the x, y and θ error signals previously described. Signals from the D-A converters 164, 166 and 168 are coupled to the summing amplifiers 170, 172, 174 and 176 which, in turn, are coupled to the output operational amplifiers 178, 180, 182 and 184 respectively, for driving of individual x, y and θ direction transducers 28a, 28b, 28c and 28d.

Although the invention has been described with reference to x-ray lithography, it is also useful for other types of pattern replication, such as photolithography, in which case the detectors 66 and 68 would be appropriate ultraviolet photon detectors, such as photomultiplier tubes. Alternatively, the present invention would be useful in parallel electron projection lithography in which case detectors 66 and 68 would preferably be detectors of transmitted primary electrons, secondary electrons, backscattered electrons or x-rays originating from the wafer pattern. However, the present invention could also be used for automatically aligning two spaced apart masks (e.g. 60 and 62) where an index mark 64 on one of the masks 60 is capable of periodically interrupting and blocking a beam of any kind to be sensed by a suitable detector 66 and where the beam is capable of passing through an opening 65 on a second mask 62 and also through the portion of the substrate 17 between the opening 65 and detector 66.

Although the invention has been described with reference to particular embodiments thereof, it should be realized that various changes and modifications may be made therein without departing from the spirit and scope of the invention.

What is claimed is:
1. In an alignment system for processing of semiconductor wafers, a device for producing micron movement in planar orthogonal and angular directions singly and in combination of a mask with respect to a semiconductor wafer, comprising:
   a carrier having means for supporting one of the mask and the wafer, being substantially rectangular in configuration to define four orthogonally disposed sides, and including four ears orthogonally positioned with one another and respectively secured to and extending from said sides for forming outwardly projecting extensions from said carrier, said extensions respectively having a first face contiguous with one of said sides and a second face substantially at right angles with a second of said sides orthogonal to said one side;
   a support including four anchor blocks rigidly affixed to said support, each of said anchor blocks including a face substantially parallel with and spaced from said second face of each of said ears;
   four transducers, each of said transducers having means for providing at least an elongation therein and being positioned between each of said respective facing ones of said anchor block faces and said second faces of said ears;
   flat springs affixed respectively to each of said transducers and to each of said anchor block faces and said second faces of said ears, each of said flat springs having a pair of large parallel flat sides and a pair of short parallel flat sides of lesser width than said large parallel flat sides, and said large parallel flat sides being substantially parallel with said sides of said carrier; and
   means coupled to each of said transducers and intercoupling said transducer for actuating said transducer means for elongating each of said transducers singly and in combination.

2. A device as in claim 1 wherein each of said transducers comprises a hollow cylinder of piezoelectric ceramic material, and coatings of electrically conductive material adhered to the inner and outer surfaces of said hollow cylinder in electrical isolation from one another, said coatings being electrically coupled to said transducer actuating means.

3. A device as in claim 1 wherein each of said transducers comprises a tubular cylinder of thermally expandable and contractable material, and means for expanding and contracting said thermally expandable material and coupled to said transducer actuating means.

4. A device as in claim 1 wherein each of said transducers comprises a cylinder of magneto-strictive material, and an electric coil surrounding said cylinder and electrically coupled to said transducer actuating means.

5. A device as in claim 1 wherein said transducer actuating means comprises four high voltage operational type amplifiers, each of said amplifiers being electrically coupled to each of said transducers, four analog summing junctions, each of said junctions being electrically coupled to each of said amplifiers, and means for providing three electrical positional signals respectively coupled to said summing functions for inducing movement of said carrier in orthogonal and angular directions, singly and in combination.

6. In combination, means for defining a carrier, means for defining a support, and means including series connected resilient connections and rectilinearly movable transducers secured between said carrier means and said support means and positioned substantially in the same plane with said carrier means for forming the sole support for said carrier means and for moving said carrier means orthogonally and angularly, singly and in combination, with respect to said support means.

7. The combination as in claim 6 wherein each of said series of resilient connections and transducers are disposed on separate axes, and said moving means further include means for elongating and contracting said transducers singly and in combination along their respective axes.

8. The combination as in claim 6 wherein said series connected resilient connections and transducers comprise four sets, each including one of said resilient connections and said transducers, said sets being orthogonally secured with respect to one another and to said carrier means on separate axes, and said moving means further include means for elongating and contracting said transducers singly and in combination along their respective axes.

9. A method for producing orthogonal and angular movements, singly and in combination, of a structure comprising the steps of:
   supporting the structure in substantially a single plane by series connected resilient connections and rectilinearly moveable transducers for enabling movement of the structure in at least orthogonal and angular directions within the plane;
   coupling the transducers to means for causing the transducers to move rectilinearly and thereby for producing the orthogonal and angular movements of the structure in the plane; and
   moving the structure by supplying orthogonal and angular positioning signals from the movement producing means to the transducers for effecting the orthogonal and angular movements, singly and in combination.

10. A method as in claim 9 wherein said supporting step comprises the step of:
   securing four individual series of the resilient connections and the rectilinearly movable transducers in the plane to the structure at mutually positioned orthogonal contact areas thereon.

11. A system for aligning a particle beam mask with a wafer pattern so that a mark on the mask is aligned with an opening in the wafer pattern, including:
   a. means for providing relative oscillatory motion between said mark and said opening to thereby periodically interrupt a beam passing between said mask and said wafer pattern and through said opening,
   b. detection means responsive to said periodically interrupted particle beam for generating pulses whose instantaneous rate is proportional to the magnitude of the instantaneous misalignment between said mark and said opening and whose instantaneous phase is dependent upon the direction of instantaneous misalignment between said mark and said opening,
   c. means coupled to said detection means for comparing the pulse rate output of said detection means with a chosen reference frequency and producing an error signal whose magnitude is proportional to the change in pulse rate output from said detection means and whose sign is determined by the instantaneous phase of said pulses, and
   d. means coupled to said error signal producing means and responsive thereto for imparting a corresponding correcting motion to either said mask or to said wafer pattern to align said mark with said opening and provide a closed loop nulling action for alignment between said mark and said opening.

12. The system defined in claim 11 wherein said means for providing relative oscillatory motion between said mark and said opening include:
   a. an $x$-motion oscillator electromechanically connected to drive one of said mask and said wafer pattern for providing a predirected orthogonal motion to the driven one,
   b. a $y$-motion oscillator electromechanically connected to drive one of said mask and said wafer pattern for providing a predirected orthogonal motion to the driven one, and
   c. said $x$ and $y$ motion oscillators also being electrically coupled to said comparison means so that the pulse train output from said detection means may be rate compared to reference signals from said $x$ and $y$ motion oscillators to thereby generate closed loop error signals for nulling said system.

13. The system defined in claim 11 including:
   a. first and second beam detection channels coupled respectively to first and second beams passing through said mask and wafer pattern to generate first and second pulse train outputs in each of said first and second channels,
   b. an $x$-error phase detector and a $y$-error phase detector connected to the output of said first detection channel for comparing the pulse rate in said first channel to first and second reference frequency signals to thereby generate a first pair of partial $x$ and $y$ error signals,
   c. an $x$-error phase detector and a $y$-error phase detector connected to the output of said second detection channel for comparing the pulse rate in said second detection channel to said first and second reference frequency signals respectively to thereby generate a second pair of partial $x$ and $y$ error signals, and
   d. summing means coupled to receive said first and second pairs of partial $x$ and $y$ error signals and responsive thereto for generating composite $x$, $y$ and $\theta$ error signals which may be utilized to drive either said mask or said wafer pattern in a closed loop corrective fashion and thereby provide a nulling action for said system.

14. The system defined in claim 11 wherein said detection means includes:
   a. first and second detection channels coupled respectively to first and second periodically interrupted beams passing through said mask and said wafer pattern for generating first and second pulse trains whose instantaneous rate and phase are controlled respectively by the instantaneous misalignment of corresponding marks and openings on each side mask and wafer pattern; said pulse comparing means includes
   b. $x$, $y$ and $\theta$ error digital phase discriminators each connected to receive input pulse trains from each of said first and second detection channels and further connected to each receive signals of $x$ and $y$ motion oscillation frequencies for thereby generating $x$, $y$ and $\theta$ word output signals proportional to the $x$, $y$ and $\theta$ misalignment between said wafer pattern and said mask, c. $x$, $y$ and $\theta$ digital-to-analog conversion means connected respectively to said $x$, $y$ and $\theta$ error digital phase discriminators for converting the word outputs of said digital phase discriminators to $x$, $y$ and $\theta$ analog error signals, and d. means coupled between said digital-to-analog conversion means and one of said wafer pattern and said mask for summing said error signals and thereby providing electrical-to-mechanical $x$, $y$ and $\theta$ control of alignment between said mask and said wafer pattern.

15. In combination, means for defining a carrier including means for defining attachment points orthogonally disposed with one another;

means for defining a support;

means comprising four transducers orthogonally secured with respect to one another and to said carrier and support means on separate axes and positioned in substantially the same plane with said carrier means and having means for elongating and contracting said transducers singly and in combination along their respective axes, thereby for moving said carrier means orthogonally and angularly, singly and in combination, with respect to said support means; and resilient means for securing each of said transducers between said attachment means and said support means, said resilient means being resilient in the direction perpendicular to the direction of transducer elongation and contraction and in the plane of movement of said carrier means.

16. In combination, means for defining a carrier including four brackets orthogonally disposed with one another;

means for defining a support;

means comprising four transducers orthogonally secured with respect to one another and to said carrier and support means on separate axes and positioned in substantially the same plane with said carrier means and having means for elongating and contracting said transducers singly and in combination along their respective axes, thereby for moving said carrier means orthogonally and angularly, singly and in combination, with respect to said support means; and means for defining resilient connections between each of said transducers and each of said brackets and between each of said transducers and said support means in cantilevered support of said carrier, said resilient means being resilient only in the direction perpendicular to the direction of transducer elongation and contraction and in the plane of movement of said carrier means.

* * * * *